(12) United States Patent
Zainuddin et al.

(10) Patent No.: US 11,139,018 B1
(45) Date of Patent: Oct. 5, 2021

(54) MEMORY DEVICE WITH TEMPORARY KICKDOWN OF SOURCE VOLTAGE BEFORE SENSING

(71) Applicant: SanDisk Technologies LLC, Addison, TX (US)

(72) Inventors: Abu Naser Zainuddin, Milpitas, CA (US); Ohwon Kwon, Pleasanton, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/007,442

(22) Filed: Aug. 31, 2020

(51) Int. Cl.
| | | |
|---|---|---|
| G11C 7/12 | (2006.01) | |
| G11C 11/4074 | (2006.01) | |
| G11C 11/4091 | (2006.01) | |
| G11C 5/14 | (2006.01) | |
| G11C 11/4097 | (2006.01) | |
| G11C 11/4094 | (2006.01) | |
| G11C 16/26 | (2006.01) | |
| G11C 16/04 | (2006.01) | |
| G11C 16/34 | (2006.01) | |
| G11C 16/24 | (2006.01) | |
| G11C 11/56 | (2006.01) | |

(52) U.S. Cl.
CPC .......... *G11C 11/4074* (2013.01); *G11C 5/146* (2013.01); *G11C 11/4091* (2013.01); *G11C 11/4094* (2013.01); *G11C 11/4097* (2013.01); *G11C 16/0483* (2013.01); *G11C 16/24* (2013.01); *G11C 16/26* (2013.01); *G11C 16/3418* (2013.01); *G11C 16/3427* (2013.01); *G11C 11/5642* (2013.01)

(58) Field of Classification Search
CPC . G11C 16/3418; G11C 16/24; G11C 16/3427; G11C 16/0483; G11C 16/26; G11C 5/146; G11C 11/5642
See application file for complete search history.

(56) References Cited

U.S. PATENT DOCUMENTS

| | | | |
|---|---|---|---|
| 9,236,128 B1 | 1/2016 | Louie et al. | |
| 9,564,236 B2 | 2/2017 | Suito | |
| 9,892,791 B2 | 2/2018 | Li et al. | |
| 10,108,546 B2 * | 10/2018 | Bar-Or | G11C 11/5628 |
| 10,204,692 B1 * | 2/2019 | Kamata | G11C 16/0483 |

(Continued)

OTHER PUBLICATIONS

U.S. Appl. No. 16/984,478, filed Aug. 4, 2020.

*Primary Examiner* — Mushfique Siddique
(74) *Attorney, Agent, or Firm* — Vierra Magen Marcus LLP

(57) ABSTRACT

Apparatuses and techniques are described for reducing read time in a memory device. A source voltage signal, Vcelsrc, and a body voltage signal, Vp-well, of a source region and a p-well, respectively, of a substrate of a NAND string are controlled to reduce the channel resistance. Vcelsrc can be temporarily reduced, e.g., provided with a negative voltage kick, while Vp-well is non-decreasing during a read operation. The negative voltage kick decreases a body bias of the NAND string in its channel to reduce the channel resistance and increase the current. The negative voltage kick can be initiated when a bit line clamp transistor is made conductive to allow a current to flow in the NAND string. The magnitude and duration of the negative voltage kick can be adjusted based on various factors.

17 Claims, 14 Drawing Sheets

(56) References Cited

U.S. PATENT DOCUMENTS

| | | |
|---|---|---|
| 10,643,677 B2 | 5/2020 | Yabe |
| 10,643,713 B1 * | 5/2020 | Louie .................. G11C 7/06 |
| 2013/0250694 A1 | 9/2013 | Kutsukake |
| 2015/0063032 A1 * | 3/2015 | Shimura ............ G11C 16/0483 |
| | | 365/185.17 |
| 2019/0392874 A1 * | 12/2019 | Yabe .................. G11C 7/1084 |
| 2021/0065770 A1 * | 3/2021 | Watanabe ........... G11C 11/4085 |

* cited by examiner

Fig. 1A
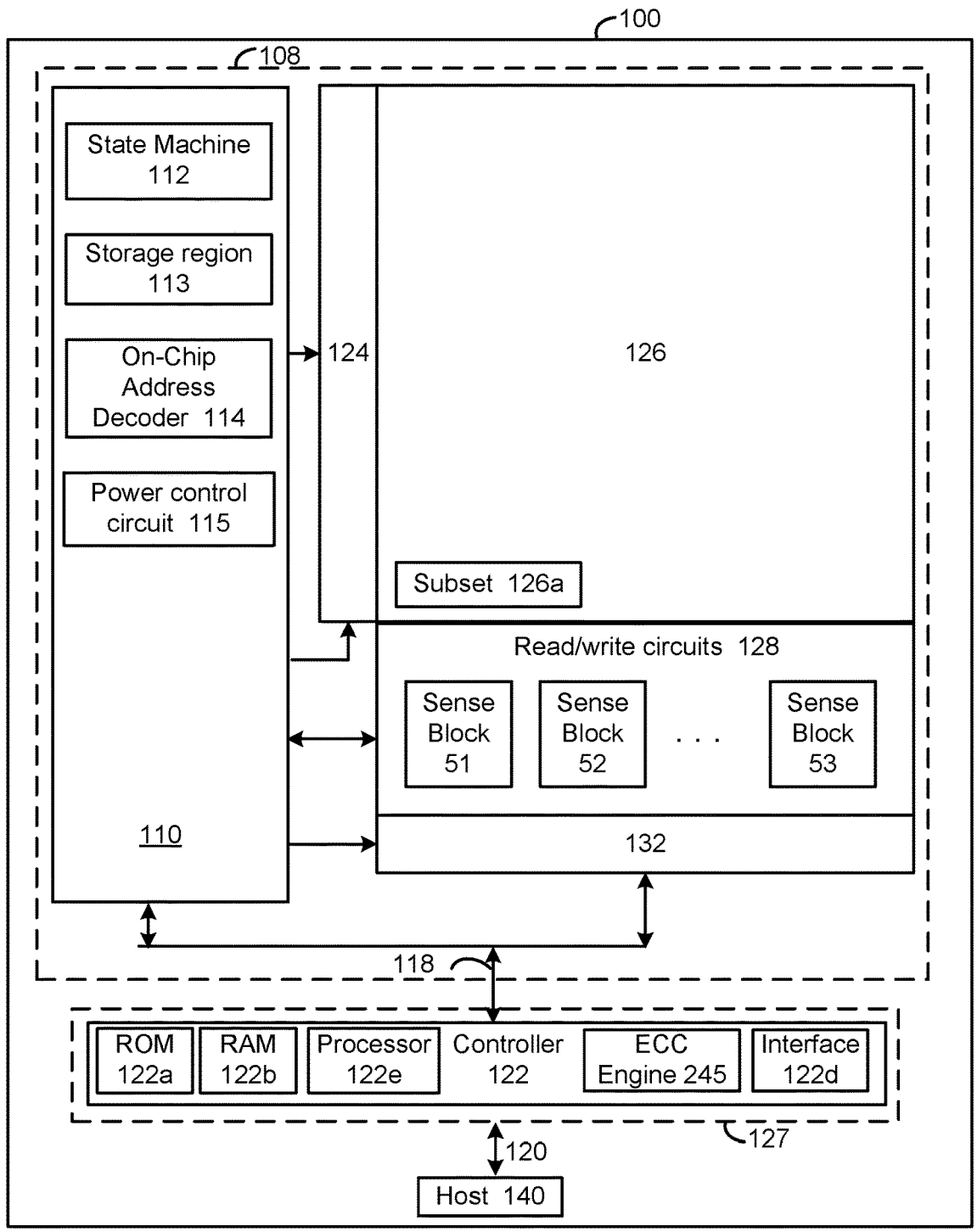
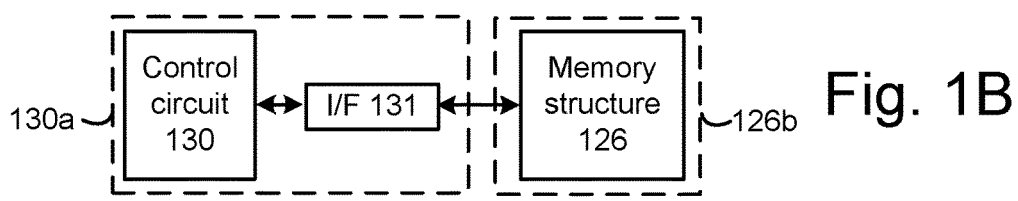
Fig. 1B

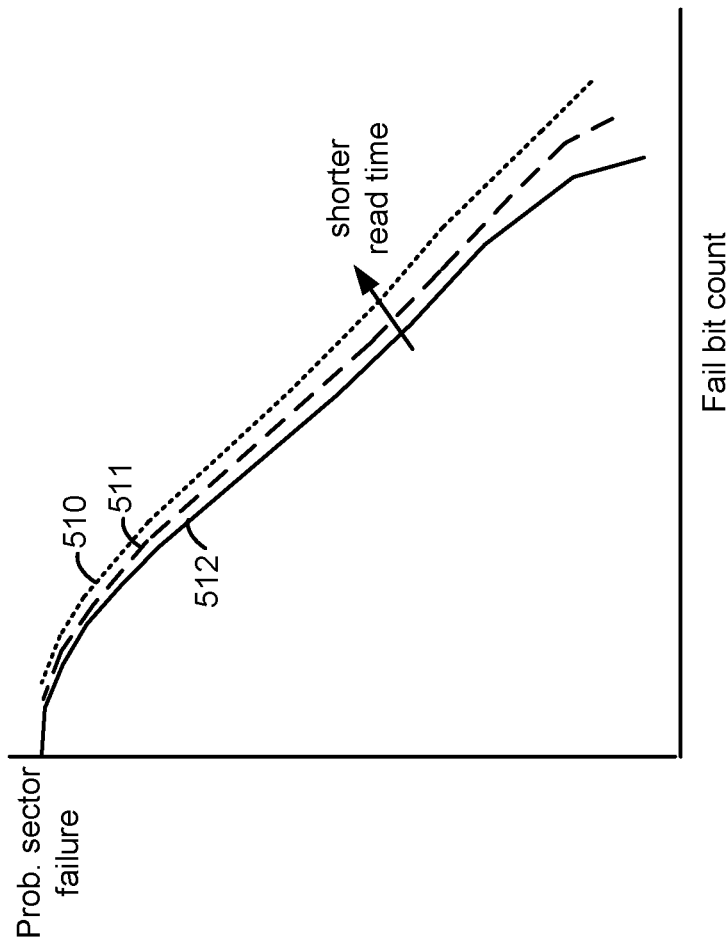
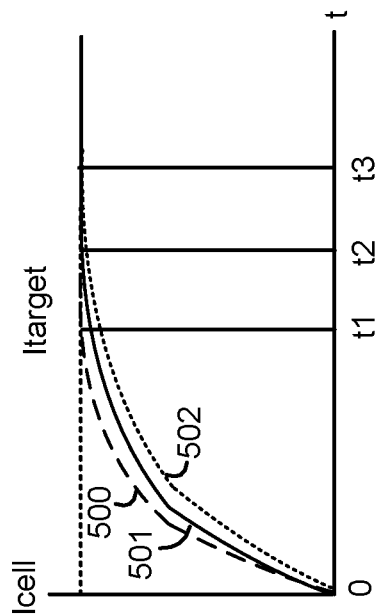
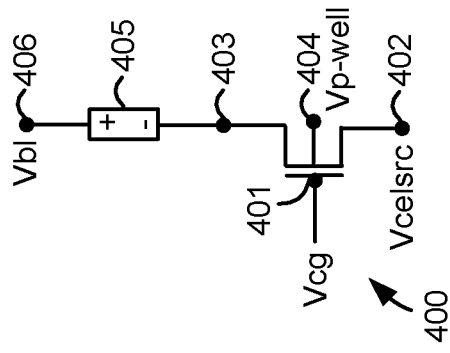

MEMORY DEVICE WITH TEMPORARY KICKDOWN OF SOURCE VOLTAGE BEFORE SENSING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 4 depicts an example memory cell in the memory device of FIG. 1A.

FIG. 5A depicts an example plot of memory cell current versus time for the memory cell of FIG. 4.

FIG. 5B depicts an example plot of a probability of a sector failure versus a fail bit count showing the effects of different read times such as depicted in FIG. 5A.

DETAILED DESCRIPTION

Figure 2:
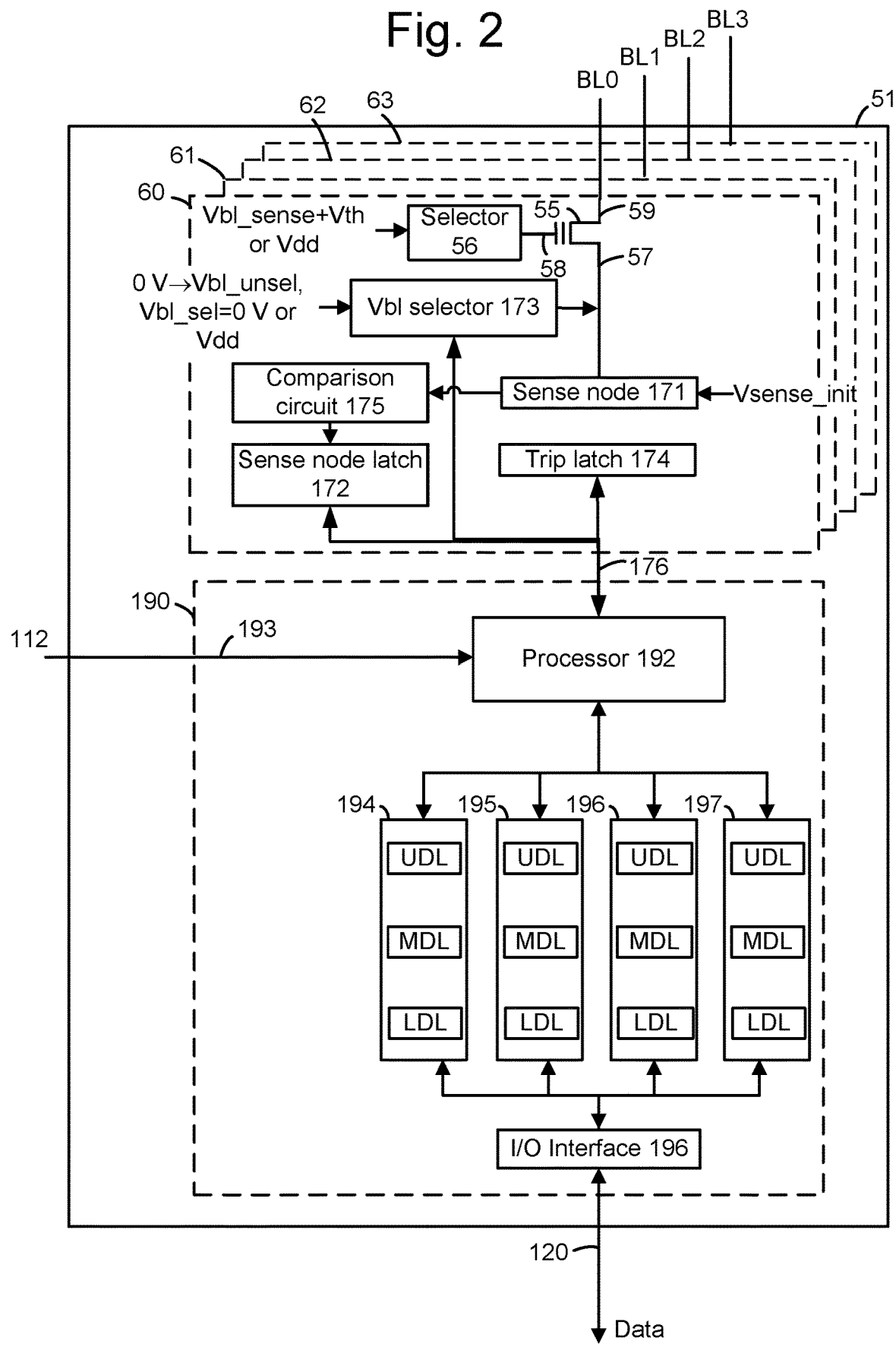
FIG. 2 is a block diagram depicting one embodiment of the sense block 51 of FIG. 1A.

Apparatuses and techniques are described for reducing read time in a memory device.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIG. 8, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 7A and 7B, for example.

In a 2D memory structure, the memory cells may be arranged in horizontal NAND strings on a substrate. See FIG. 9, for example.

The memory cells can be programmed to have a threshold voltage (Vth) which corresponds to a data state. See FIG. 10, for example. The Vth is a function of an amount of charge stored in a charge storing material of the memory cell. A read operation can be performed to determine the Vth and therefore the data state of a memory cell. Reading can also be performed in a verify test of a program operation, where the Vth of a memory cell is compared to a verify voltage applied to a corresponding word line to determine if the programming of the memory cell is completed. Reading can also be performed in a verify test of an erase operation, where the Vth of a memory cell is compared to a verify voltage applied to a corresponding word line to determine if the erasing of the memory cell is completed. During a read operation, a current, Icell, in the NAND string is compared to a reference current, Iref, in a sense circuit, while a voltage Vwl_sel is applied to a word line/control gate of the memory cell. See also FIG. 2, for example. If Icell≤Iref, Vth≥Vwl_sel. If Icell>Iref, Vth<Vwl_sel.

To accurately read a memory cell, Icell should be stable at a target level. See FIG. 5A, for example. However, this goal conflicts with the goal of having a short read time. In particular, shortening the read time can result in an increased fail bit count if the word lines and bit lines do not have sufficient time to stabilize. See FIG. 5B, for example. Word lines and bit lines tend to have a relatively high RC delay and this problem is expected to worsen in future memory devices.

Techniques provided herein address the above and other issues. In one aspect, a source voltage signal, Vcelsrc, and a body voltage signal, Vp-well, of a substrate of a NAND string are controlled to reduce the channel resistance. Vcelsrc can be temporarily reduced, e.g., provided with a negative voltage kick, while Vp-well is held constant, or even increased, during a read operation. See FIG. 12 at t2-t4, for example. Generally, Vp-well and Vcelsrc can be set so that Vp-well>Vcelsrc during the voltage kick. The negative voltage kick decreases a body bias of the NAND string in its channel to reduce the channel resistance and increase the current. The negative voltage kick can be initiated when a bit line clamp transistor is made conductive to allow a current to flow in the NAND string. Further, the magnitude and duration of the negative voltage kick can be adjusted based on various factors such as the position of the NAND string in the block and the distance of the NAND string from a word line driver.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. For example, see FIG. 7A. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130*a* communicates with the memory structure 126 on a separate second die 126*b*. The control circuit may communicate with the memory structure and the die 126*b* via a memory interface 131, for example, similar to the memory interface 122*d*. Examples of a memory interface (I/F) include the Common Flash Memory Interface of JEDEC. The techniques described herein can be implemented with a control die 130*a* bonded to one or more memory die 126*b*, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130*a* and another portion of the read/write circuits are located on memory die 126*b*. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit.

Figure 12:
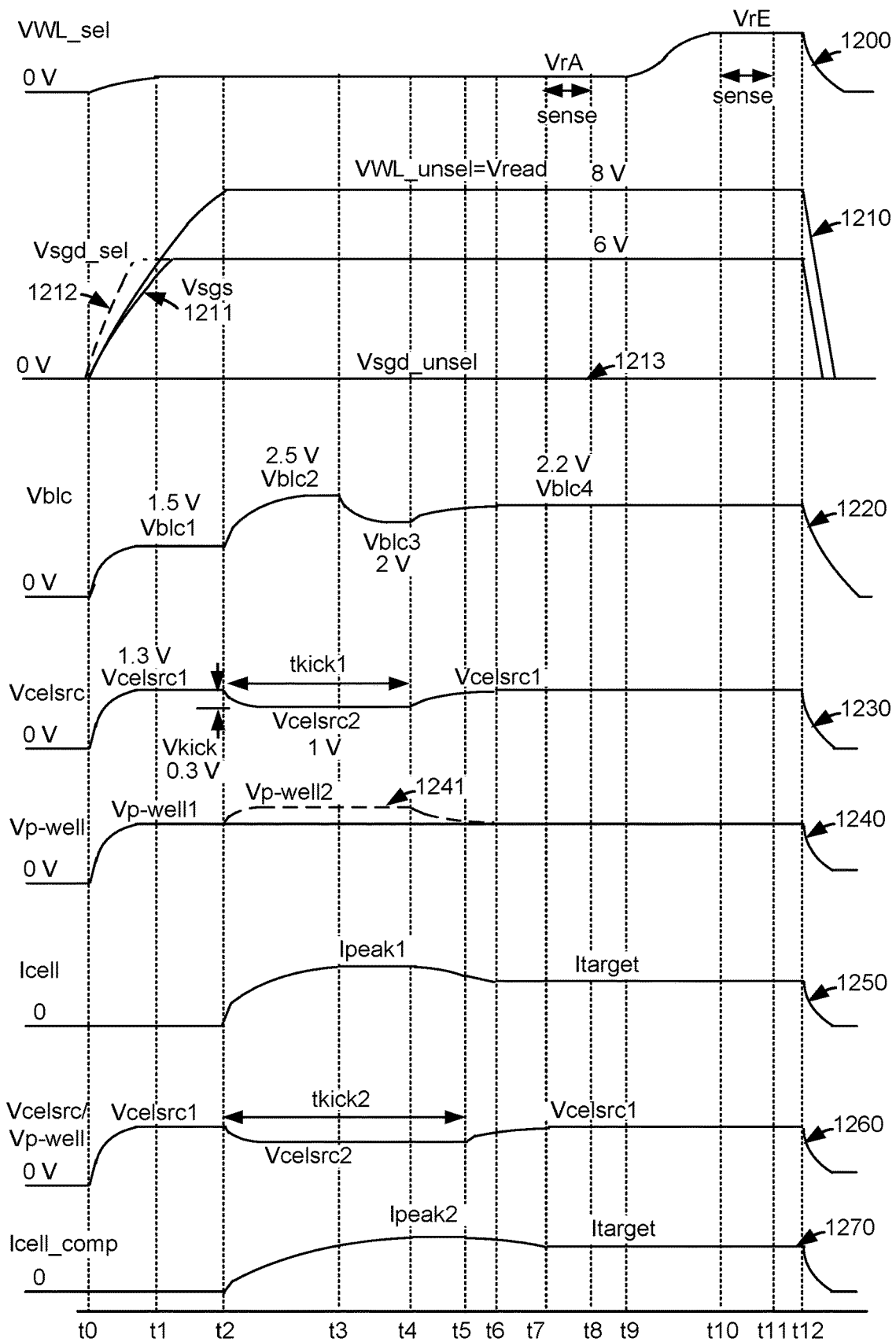
FIG. 12 depicts example voltage signals and Icell in a read operation, consistent with FIG. 11.

The circuit can be configured to issue command via the memory interface to apply different voltage signals to bit lines, word lines, select gate lines and the substrate including a p-well. For example, the control circuit can issue commands to the CELSRC driver 332 in FIG. 3 to provide the voltage signal Vcelsrc of FIG. 12, plot 1230. The commands can include a sequence of: set Vcelsrc=0 V at t0, set Vcelsrc=Vcelsrc1 at t0-t2, set Vcelsrc=Vcelsrc2 for a time period tkick1 at t2-t4, set Vcelsrc=Vcelsrc1 at t4-t12 and set Vcelsrc=0 V at t12. As another example, the control circuit can issue commands to the p-well voltage driver 330 in FIG. 3 to provide the voltage signal Vp-well of FIG. 12, plot 1240. The commands can include a sequence of: set Vp-well=0 V at t0, set Vp-well=Vp-well1 at t0-t12, and set Vp-well=0 V at t12.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg−Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg−Vcelsrc−Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
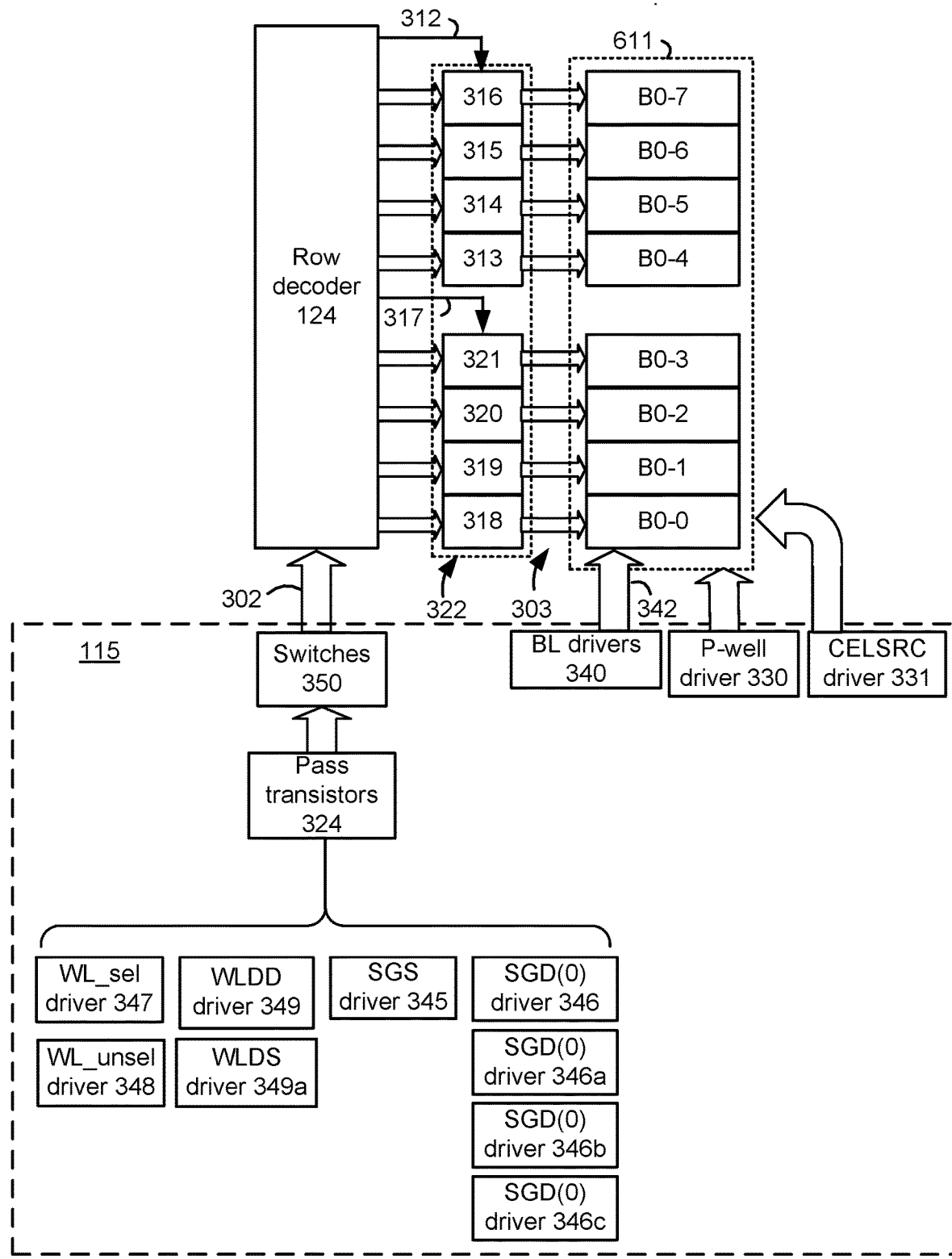
FIG. 3 depicts an example implementation of the power control circuit 115 of FIG. 1A for providing voltages to blocks of memory cells in a plane.
Figure 8:
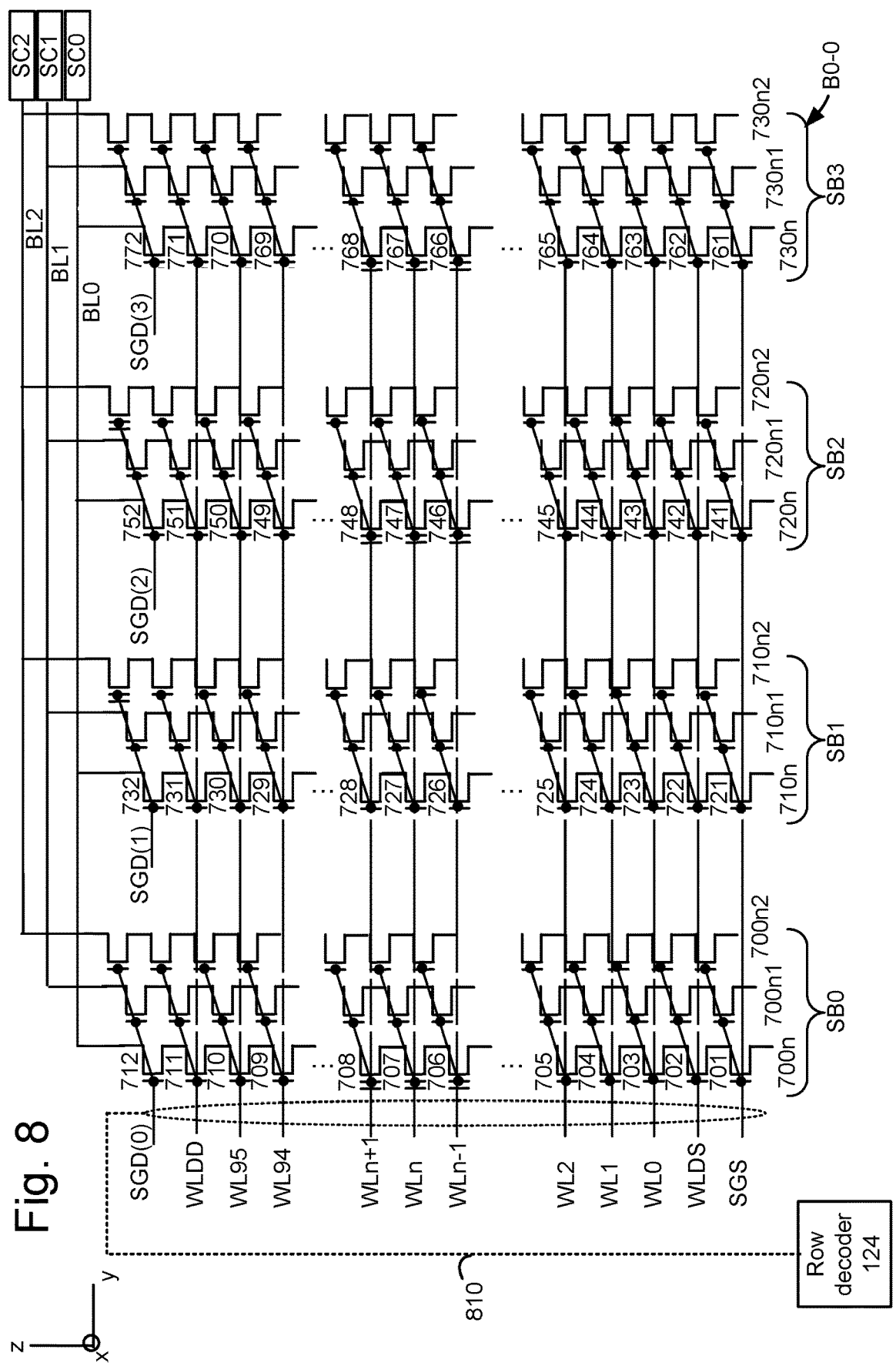
FIG. 8 depicts an example view of the block B0-0 of FIG. 6, with respective NAND strings arranged in sub-blocks, along with associated bit lines and sense circuits.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 6. The blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 8. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage on a data word line selected during a program or read operation. For example, the WL_sel driver 347 can provide a pre-charge voltage and a program voltage on the selected word line during a program loop of a program operation, or provide a read voltage on the selected word line during a read operation. The WL_unsel driver 348 provides a voltage on unselected data word lines, such as Vread during a read operation. Dummy word line drivers are also provided. The WLDD driver 349 provides a voltage on the drain-side dummy word line, WLDD, and the WLDS driver 349a provides a voltage on the source-side dummy word line, WLDS. WLDD and WLDS could also receive Vread during a read operation. See also FIG. 12.

The voltage drivers can also include separate SGD drivers for each sub-block. For example, the SGD(0) driver 346, SGD(1) driver 346a, SGD(2) driver 346b and SGD(3) driver 346c can be provided for SB0, SB1, SB2 and SB3, respectively, such as in FIG. 8. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 724 in the p-well region 792, e.g., via the conductive path 682. See FIG. 7A. In one approach, the p-well region 792 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 723 in the p-well region 792, e.g., via the local interconnect 723a in FIG. 7A. As described further below, both Vcelsrc and Vp-well can be provided to the source end of a NAND string concurrently via the substrate to bias the NAND string in a way which reduces resistance during a read operation.

Bit line voltage drivers 340 include voltage sources which provide voltages to the bit lines 342. The bit line voltage for sensing can be 0.5 V, for example.

FIG. 4 depicts an example memory cell in the memory device of FIG. 1A. The memory cell 400 is a type of a transistor. For example, the memory may be based on n-channel MOSFET transistor which includes a charge storage layer, such as a charge trapping material (e.g., SiN) or a floating gate layer (e.g., doped polysilicon). The memory cell can be in a 2D or 3D memory device. The memory cell comprises a control gate 401 having a voltage Vcg, a drain 403 having a voltage Vbl, a source 402 having a voltage Vcelsrc, and a body 404 having a voltage Vp-well. The drain is connected to a bit line 406 having a voltage Vbl via a voltage drop 405 which represents a voltage of the other memory cells in a NAND string. Assuming this voltage drop is negligible, the drain voltage is Vbl and the source voltage is Vcelsrc.

FIG. 5A depicts an example plot of memory cell current, Icell, versus time for the memory cell of FIG. 4. As mentioned at the outset, to accurately read a memory cell, Icell should be stable at a target level, Itarget. However, another goal is for the read time to be as short as possible. In order for Icell to be stable as soon as possible, it should ramp up or increase as quickly as possible to Itarget. In this example, Icell begins to increase at t=0. The plots 500, 501 and 502 represent Icell reaching Itarget at the progressively longer times of t1, t2 and t3, respectively. If the read time is at t1, for example, the longer read times of t2 and t3 of plots 501 and 502, respectively, can result in a read error since Icell is not yet stable. Shortening the read time too much may therefore be unacceptable if the allowed ramp up time of Icell is too low.

FIG. 5B depicts an example plot of a probability of a sector failure versus a fail bit count (FBC) showing the effects of different read times such as depicted in FIG. 5A. A sector is a smallest logical unit of a memory device and can comprise, e.g., 512-2048 kB. A page of data can comprise, e.g., 32 or 64 sectors. As mentioned, shortening the time allowed for Icell to ramp up to Itarget can result in read errors. The cases of plots 500-502 of FIG. 5A are represented by the plots 510-512, respectively, in FIG. 5B. For a given desired FBC and for a given ramp up rate, the probability of a sector failure increases as the read time decreases.

Figure 6:
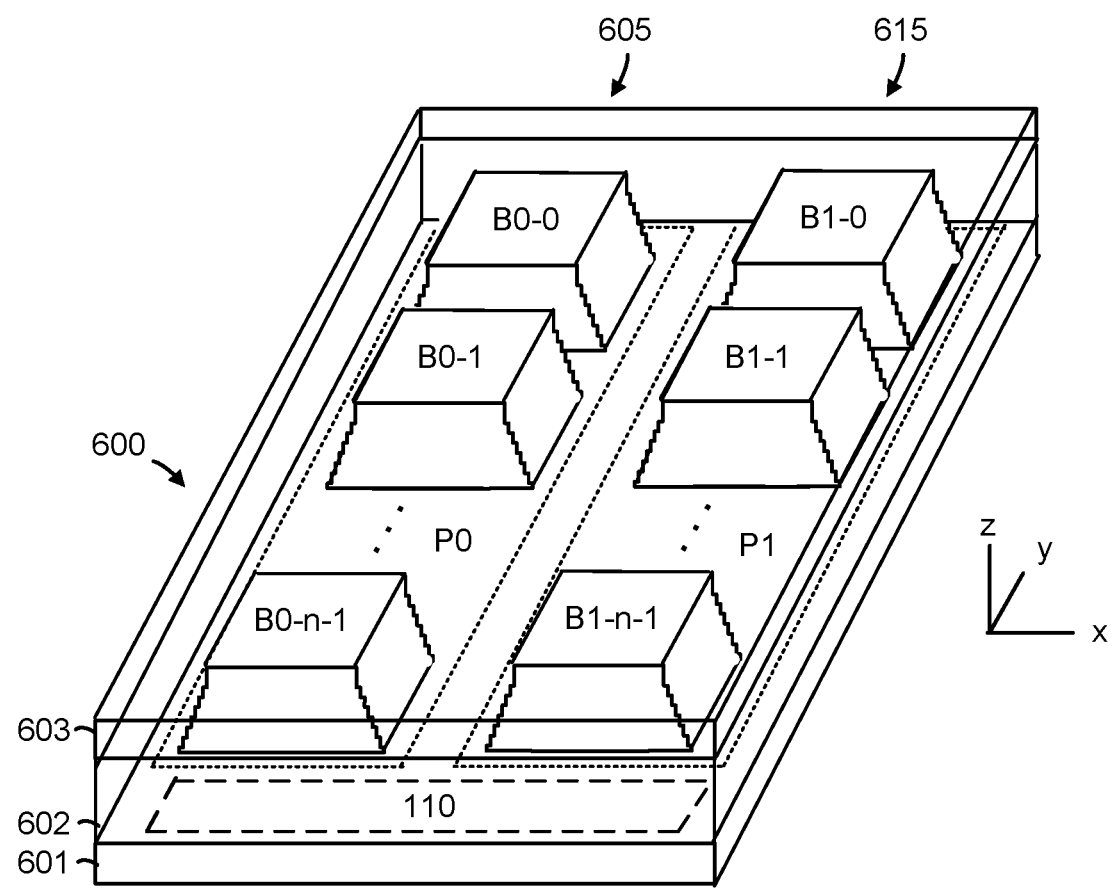
FIG. 6 is a perspective view of an example memory die 600 in which blocks are provided in respective planes P0 and P1, consistent with FIG. 1A.

FIG. 6 is a perspective view of an example memory die 600 in which blocks are provided in respective planes P0 and P1, consistent with FIG. 1A. The memory die includes a substrate 601, an intermediate region 602 in which blocks of memory cells are formed, and an upper region 603 in which one or more upper metal layers are patterned such as to form bit lines. Planes P0 and P1 represent respective isolation regions which are formed in the substrate 601. Further, a first block sequence 605 of a number n blocks, labelled B0-0 to B0-$n$-1, are formed in P0, and a second block sequence 615 of a number n blocks, labelled B1-0 to B1-$n$-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 601 can also carry circuitry under the blocks, and one or more lower metal layers which are patterned in conductive paths to carry signals of the circuitry.

Figure 7A:
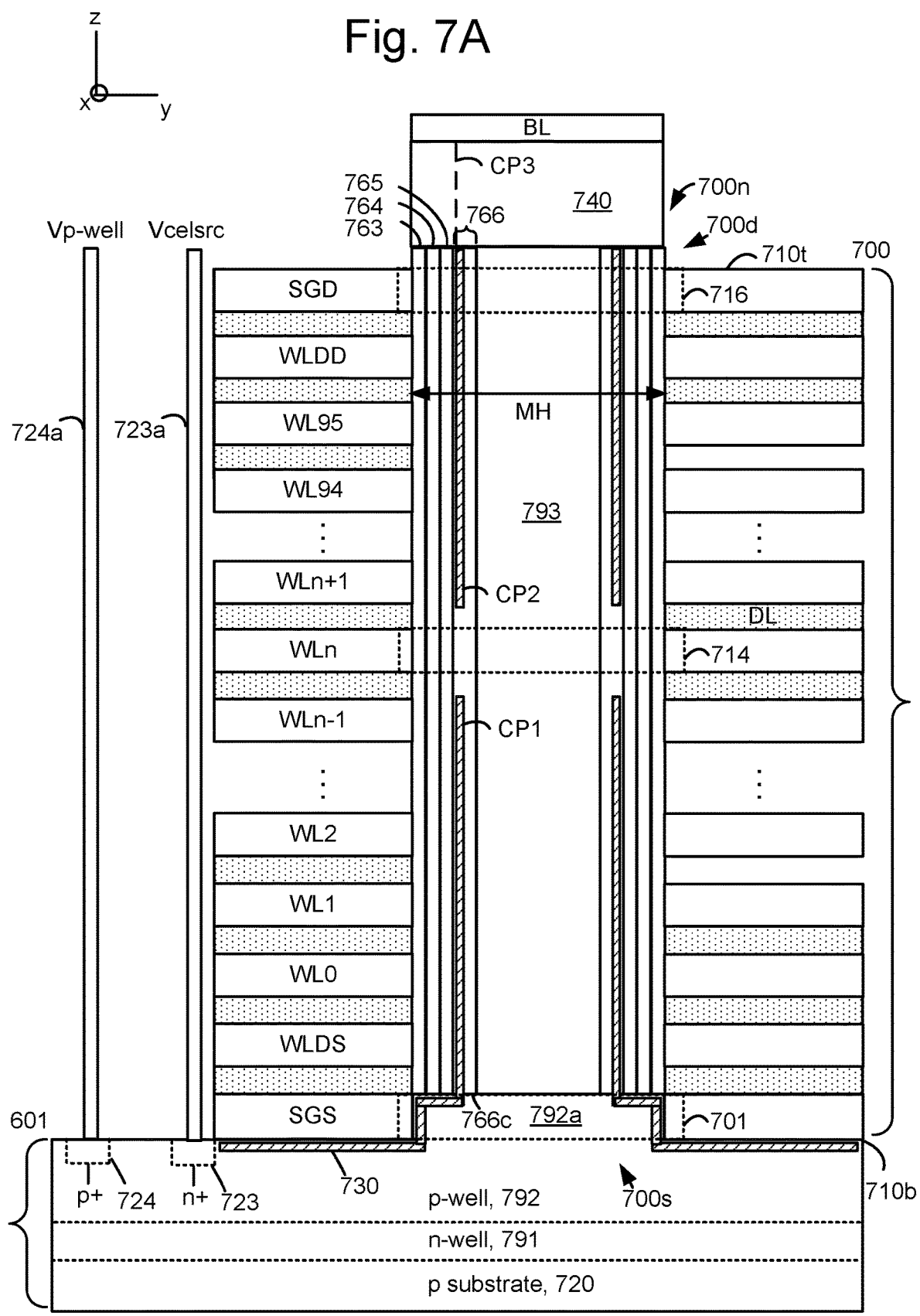
FIG. 7A depicts an example cross-sectional view of a portion of the block B0-0 of FIG. 6, including a NAND string 700n, where a conductive path does not extend in a memory cell 714 connected to WLn.

In this example, the memory cells are formed in vertical NAND strings in the blocks, consistent with FIG. 7A. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

Figure 9:
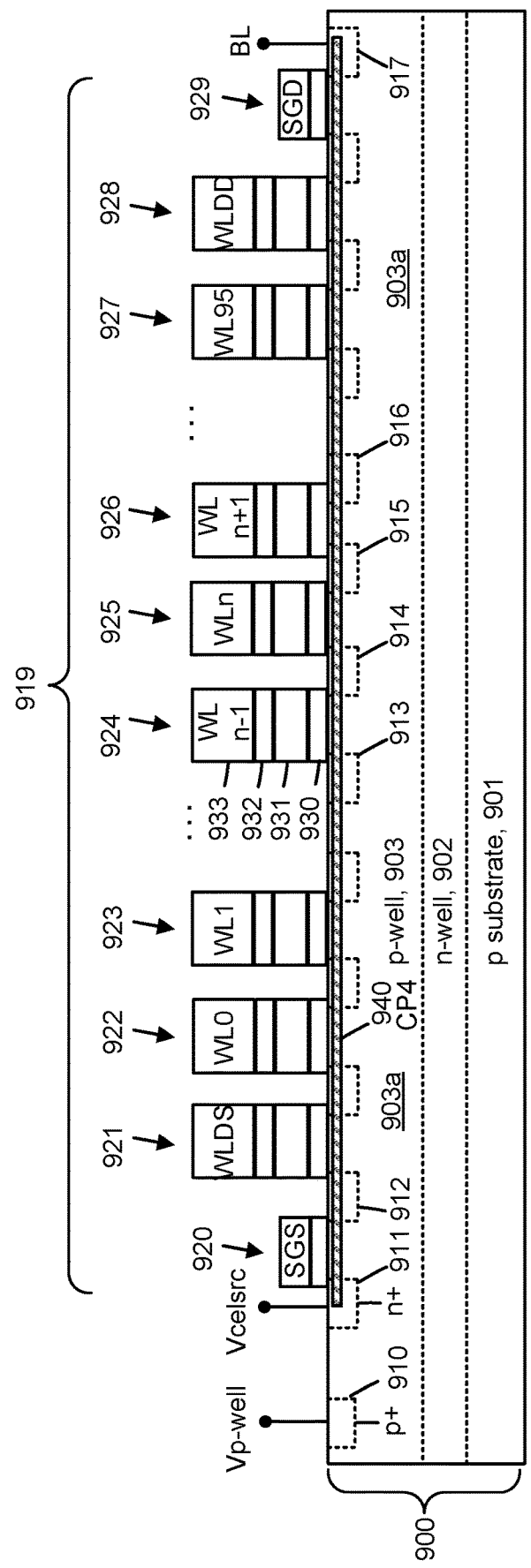
FIG. 9 depicts an example NAND string in a 2D configuration.

While the above example is directed to a 3D memory device with vertically extending NAND strings, the techniques provided herein are also applicable to a 2D memory device in which the NAND strings extend horizontally on a substrate, consistent with FIG. 9.

FIG. 7A depicts an example cross-sectional view of a portion of the block B0-0 of FIG. 6, including a NAND string 700$n$, where a conductive path does not extend in a memory cell 714 connected to WLn. The block comprises a stack 700 of alternating conductive layers (word line layers) and dielectric layers. The layers may be rectangular plates having a height in the z direction, a width in the y direction, and a length in the x direction. Example conductive layers include SGS, WLDS, WL0, WL1, WL2, WLn-1, WLn, WLn+1, WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 7B).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 710$t$ and bottom 710$b$ of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, and a selected memory cell 714 is formed where WLn intersects with the multiple thin layers.

The multiple thin annular layers and can be deposited, e.g., using atomic layer deposition. For example, the layers can include a blocking oxide layer 763, a charge-trapping layer 764 or film such as silicon nitride (Si3N4) or other nitride, a tunneling layer 765 (e.g., a gate oxide) and a channel layer 766 (e.g., comprising polysilicon). A dielectric core 793 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area of a NAND string.

The stack is formed on a substrate 601. In one approach, the substrate includes a p-well region 792 (see also FIG. 3) connected to the source ends of the NAND strings. The p-well region may comprise an epitaxial region 792a which extends upward adjacent to the SGS layer. The p-well region can include an n+ contact 723 connected to a local interconnect 723a (a conductive path or source line) for receiving Vcelsrc, and a p+ contact 724 connected to a conductive path 724a for receiving Vp-well. The local interconnect and conductive path can comprise a conductive material such as metal surrounded by an insulating material to prevent conduction with the metal of the adjacent word lines. The p-well region 792 can be formed in an n-well 791, which in turn is formed in a p-type semiconductor region 720 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

During a read operation, Vcelsrc and Vp-well may be applied to the contacts 723 and 724, respectively. The application of Vcelsrc can create a conductive path CP1 or channel which extends from the contact 723 to WLn, in this example. CP1 is formed in the p-well. In particular, CP1 extends under the SGS control line, to the side of the SGS control line and in a portion 766a (see FIG. 7B) of the channel layer 766 in which an inversion layer is formed. This inversion layer is a channel through which current can pass between the source and drain terminals of each of the memory cells connected to WLDS through WLn−1. The SGS control line and the word lines WLDS through WLn−1 receive a voltage, e.g., Vread, which is sufficiently high to place the corresponding transistors in a conductive state, to allow the inversion layer to form. Further, in this example, the voltage applied to WLn is not sufficiently high to place the memory cell 714 in a conductive state. As a result, CP1 ends at WLn−1. CP1 is biased at Vcelsrc.

Also during the read operation, Vbl is applied at the bit line BL. A conductive path CP2 is formed in a via 740 which extends from the bit line to the top of the NAND string. CP3 continues to a conductive path CP2 in the portion 766a of the channel layer 766 from the SGD control line to WLn+1. CP2 extends to the side of the SGD control line and in the portion 766a of the channel layer 766 in which an inversion layer is formed. This inversion layer is a channel through which current can pass between the source and drain terminals of each of the memory cells connected to WLDD through WLn+1. The SGD control line and the word lines WLDD through WLn+1 receive a voltage, e.g., Vread, which is sufficiently high to place the corresponding transistors in a conductive state, to allow the inversion layer to form. In this example, the memory cell 714 is in a non-conductive state, so that CP2 ends at WLn−1. CP2 is biased at Vcelsrc+Vbl.

Figure 7B:
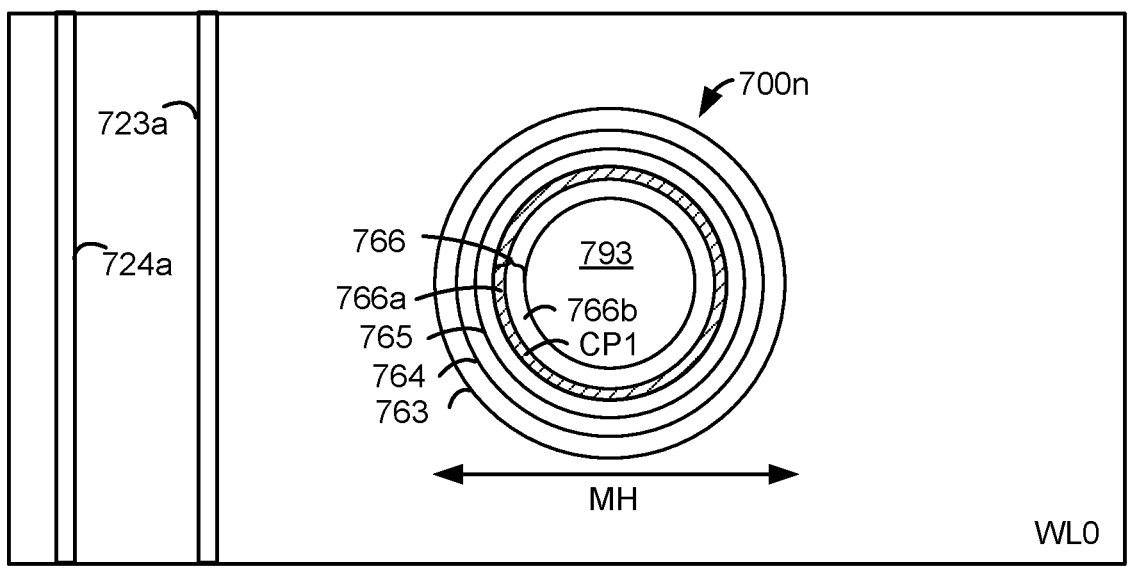
FIG. 7B depicts an example cross-sectional view of the block portion of FIG. 7A in the x-y plane at the level of WL0.
Figure 7C:
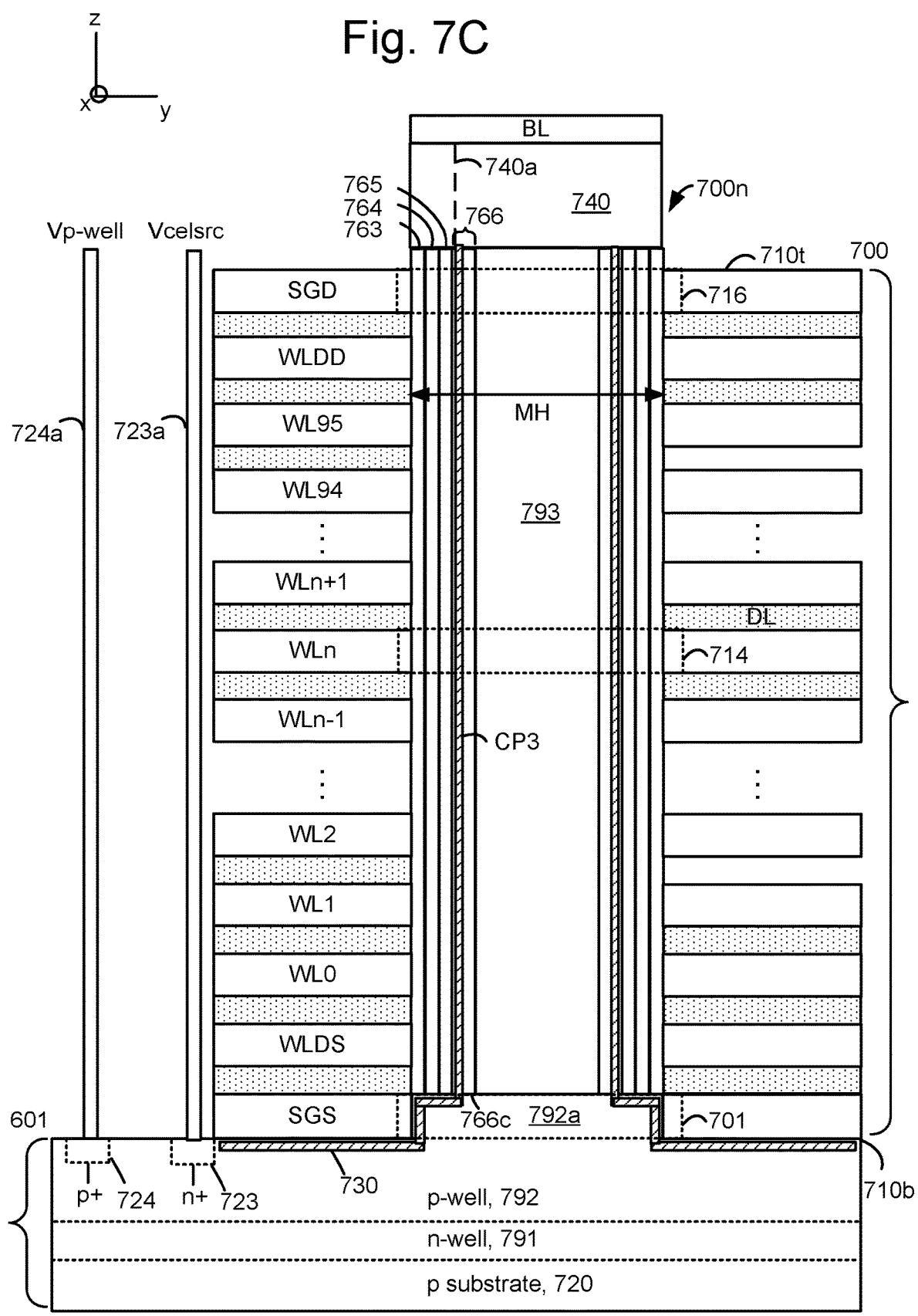
FIG. 7C depicts an example cross-sectional view of a portion of the block B0-0 of FIG. 6, including a NAND string 700n, where a conductive path CP3 extends in a memory cell 714 connected to WLn.

See FIG. 7C for an example in which the memory cell 714 is in a conductive state.

When Vp-well is applied to the p-well via the contact 724, a remaining portion of the channel layer in which the inversion layer is not formed (see, e.g., the portion 766b in FIG. 7B) is biased at Vp-well. This is a result of the bottom 766c of the channel layer 766 contacting the epitaxial region 792a of the p-well at the bottom of the NAND string. Since the inversion layer is limited to a portion 766a of the channel layer which is adjacent to the tunneling layer 765, a remaining portion 766b of the channel layer is available for biasing at Vp-well. Accordingly, the channel layer 766 can be biased concurrently at Vcelsrc and Vp-well, which can be equal or different.

By providing a temporary kick down (Vkick) of Vcelsrc while not decreasing Vp-well during the ramp up of Icell (see also FIG. 12), the ramp up time can be shortened without increasing the number of read errors. For example, by reducing Vcelsrc from an initial voltage, e.g., 1.3 V, to a reduced voltage, e.g., 1 V, and keeping Vp-well constant at the initial voltage or another voltage which is greater than the reduced voltage, the Vth of the memory cells is reduced. As a result, the resistance in the channel is also reduced and Icell can ramp up more quickly. This result can be understood by observing that a formula for the threshold (Vth) of a memory cell transistor is:

$$Vth = V_{FB} + 2\phi_F + \frac{\sqrt{2\varepsilon q N_a(2\phi_F + V_{SB})}}{C}.$$

$V_{FB}$ is the flat band voltage. $\phi F$ is the bulk potential. The third term is the voltage across the oxide due to the depletion layer charge. In the third term, c is the dielectric constant of silicon, q is an electron charge, Na is the substrate doping density, $V_{SB}$ is the source-to-body voltage, and C is the gate oxide capacitance per unit area. With a source voltage Vcelsrc, and a body voltage Vp-well, reducing Vcelsrc also reduces $V_{SB}$. This, in turn, reduces Vth. Generally, Icell increases as Vth decreases and as Vgate-to-source increases.

The kick down in Vcelsrc does not result in forward biasing the junctions of the transistors as long as Vkick is not too great. Generally, Vkick should be less than about 0.7 V, in one approach. In FIGS. 7A and 7C, the conductive paths are shown by diagonal shading.

In the example of FIG. 7A, the NAND string extends vertically on a substrate, the source end is in contact with a p-well of the substrate, and the source voltage signal, Vcelsrc, and the body voltage signal, Vp-well, are applied to the p-well FIG. 7B depicts an example cross-sectional view of the block portion of FIG. 7A in the x-y plane at the level of WL0. The layers of the NAND string 700n are depicted, including the blocking oxide layer 763, charge-trapping layer 764, tunneling layer 765 and the channel layer 766. The dielectric core 793 is also depicted. As mention, the channel layer 766 includes one portion 766a which is adjacent to the tunneling layer 765. An inversion layer is formed in the portion 766a to carry Vcelsrc in CP1, while another portion 766b of the channel layer acts as the body of the memory cells and is biased at Vp-well. Thus, one portion of the channel layer is biased by the source voltage signal, Vcelsrc, and another portion of the channel layer is biased by the body voltage signal, Vp-well. The inversion layer is formed by the biasing of the one portion of the channel layer with the source voltage signal.

FIG. 7C depicts an example cross-sectional view of a portion of the block B0-0 of FIG. 6, including a NAND string 700n, where a conductive path CP3 extends in a memory cell 714 connected to WLn. In this example, the memory cell 714 is in a conductive state so that a single continuous conductive path CP3 extends from the contact 723, through a portion of the p-well, and though the entire length of the channel layer 766. CP3 is biased at Vcelsrc.

FIG. 8 depicts an example view of the block B0-0 of FIG. 6, with respective NAND strings arranged in sub-blocks, along with associated bit lines and sense circuits. The NAND strings are arranged in sub-blocks of the block in a 3D configuration. Each sub-block SB0-SB3 includes multiple NAND strings. Three example NAND strings are depicted as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines consistent with FIG. 7A. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n, BL1 is connected to NAND strings 700n1, 710n1, 720n1 and 730n1, and BL2 is connected to NAND strings 700n2, 710n2, 720n2 and 730n2. Each bit line is also connected to a respective sense circuit, consistent with the sense circuits 60-63 of FIG. 2. For example, BL0-BL2 are connected to sense circuits SC0-SC2, respectively.

Figure 13:
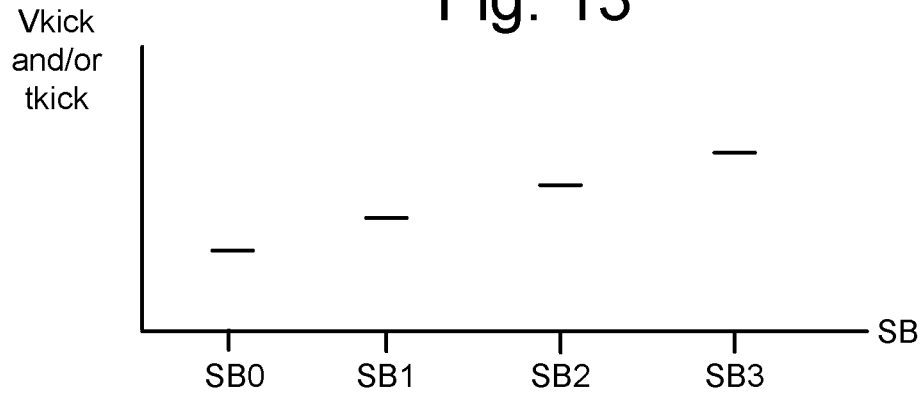
FIG. 13 depicts a plot of Vkick and/or tkick versus a selected sub-block, representing a distance from a WL driver, consistent with FIG. 8.

The row decoder 124 is at one side of the block in this example, in a peripheral area of the substrate, consistent with the control circuitry 110 depicted in FIG. 6. The row decoder routes voltage signals to the word line via conductive paths 810. In one approach, the conductive paths extend vertically in the z direction to the upper region 603, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3. To accommodate the varying RC delays of the different sub-blocks, the voltage kick for Vcelsrc, as well as the duration of the voltage kick, can be adjusted based on the sub-block which is being read, such as depicted in FIG. 13.

FIG. 9 depicts an example NAND string in a 2D configuration. The techniques discussed herein for controlling Vcelsrc and Vp-well to increase Icell ramp up time can be used in a 2D memory device as well as the above-described 3D memory device. The channel in a 2D memory device extends horizontally in the substrate rather than in a vertically extending channel layer. In this example, a substrate 900 includes a p-well 903 within an n-well 902, which in turn is in a p substrate 901. Vp-well and Vcelsrc are provided to the p-well via contacts 910 and 911, respectively. A NAND string 919 is arranged on the substrate and include select gate transistors and memory cells. For example, the NAND string includes a SGS transistor 920, memory cells 921, 922 and 923 connected to WLDS, WL0 and WL1, respectively, memory cells 924, 925 and 926 connected to WLn−1, WLn and WLn+1, respectively, memory cells 927 and 928 connected to WL95 and WLDD, respectively, and a SGD transistor 929. Doped regions in the substrate, such as example doped regions 911-917, act as sources and drains of the transistors. Vbl is provided to the doped region 917. When appropriate voltages are provided to the NAND string, an inversion layer or channel 940 is formed in the p-well. A remaining portion 903a of the p-well is biased at Vp-well.

The example memory cell 924 comprises a tunneling layer 930, a floating gate layer 931, a blocking oxide layer 932 and a control gate 933.

In this example, the NAND string extends horizontally on a substrate, the source voltage signal is applied to an n+ contact in the p-well and the body voltage signal is applied to a p+ contact in the p-well.

In the 2D or 3D configuration, in one approach, the source voltage signal is applied to an n+ contact in the p-well and the body voltage signal is applied to a p+ contact in the p-well.

Figure 10:
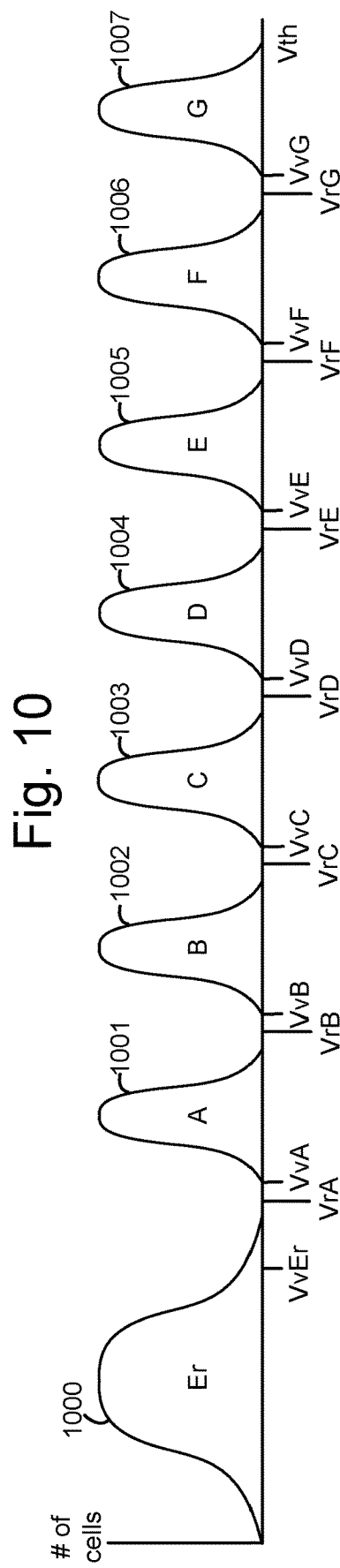
FIG. 10 depicts threshold voltage (Vth) distributions for an eight-state memory device.

FIG. 10 depicts threshold voltage (Vth) distributions for an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 1000 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 1001-1007, respectively. These memory cells are subject to verify tests using verify voltages of VvA–VvG.

Ina read operation, the memory cells can be read by applying the read voltages VrA–VrG applied to the selected word line. In one approach, one page of data is read at a time. For example, a lower page of data can be read using VrA and VrE (consistent with FIG. 12), a middle page of data can be read using VrB, VrD and VrF, and an upper page of data can be read using VrC and VrG.

Figure 11:
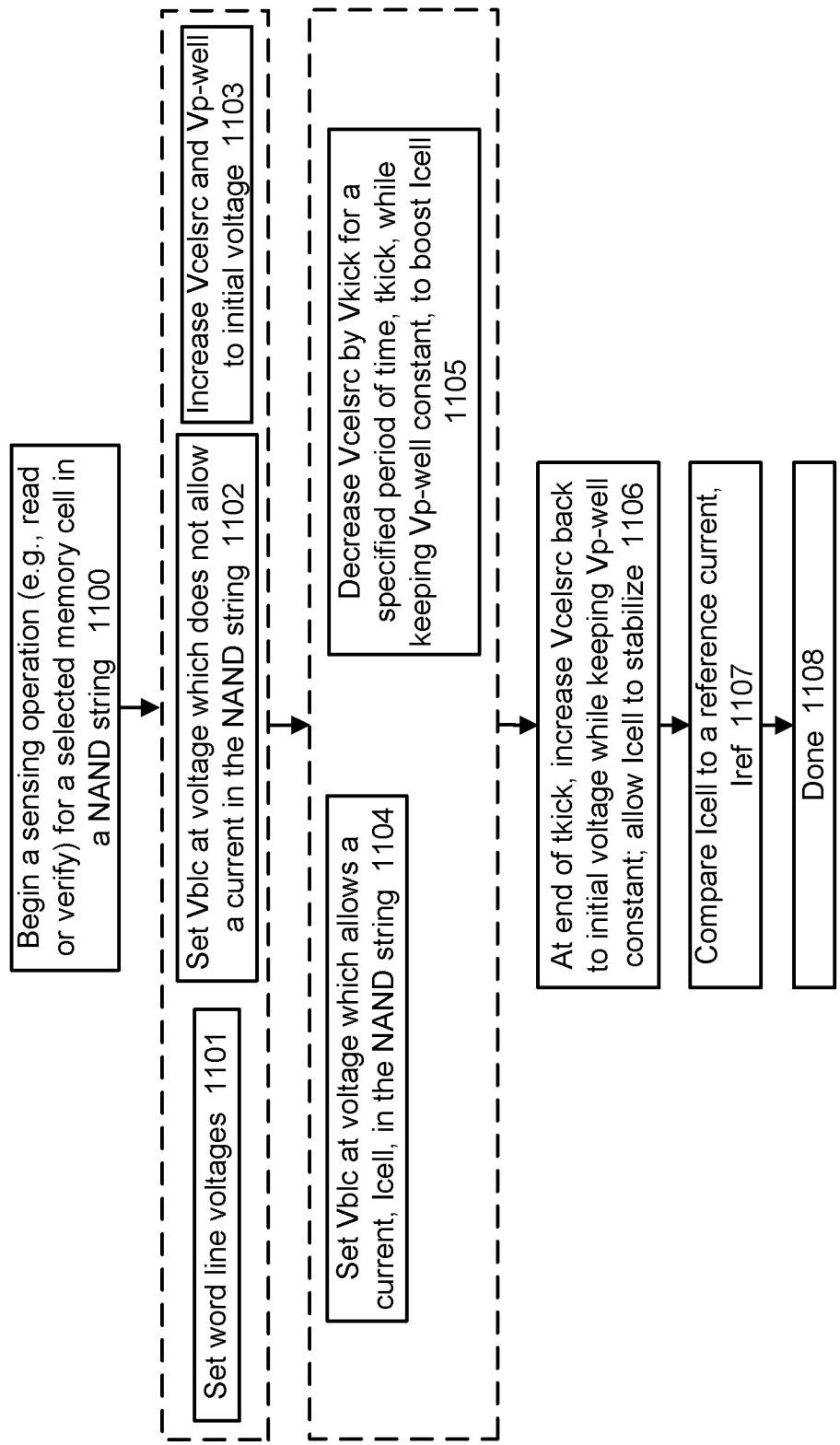
FIG. 11 depicts an example process for reducing read time in a NAND string.

FIG. 11 depicts an example process for reducing read time in a NAND string. Step 1100 begins a sensing operation (e.g., read or verify) for a selected memory cell in a NAND string. For example, this could be the memory cell 714 connected to WLn in FIG. 7A. Selected memory cells in multiple NAND strings can be read concurrently.

Next, steps 1101-1103 are performed. These steps can be concurrent, at least in part, and can occur at t0-t2 in FIG. 12. Step 1101 includes setting word line voltages. The selected word line, WLn, can receive a read voltage, e.g., VrA–VrG, such as depicted at plot 1200 in FIG. 12, while the remaining, unselected word line can receive a pass voltage, Vread, such as depicted at plot 1210 in FIG. 12. Vread can be 8-9 V, for example, and provides the memory cells connected to the unselected word lines in a strongly conductive state. This allows the Vth of the selected memory cell in a NAND string to be sensed without interference from other memory cells in the NAND string. A voltage such as 6 V can be provided to the SGS transistors and the selected SGD transistors to also provide them in a strongly conductive state, such as depicted at plots 1211 and 1212, respectively, in FIG. 12. A voltage such as 0 V can be provided to the unselected SGD transistors to provide them in a non-conductive state, such as depicted at plot 1213 in FIG. 12. The selected SGD transistors are in the selected sub-block in which the read occurs. The unselected SGD transistors are in the remaining, unselected sub-blocks.

Step 1102 includes setting Vblc at a voltage which does not allow a current to flow in the NAND string, such as depicted at plot 1201 in FIG. 12. This can be a positive voltage on the control gate 58 of the BLC transistor 55 in FIG. 2. This positive voltage can be about 1.5 V, which does not exceed the sum of the Vth of BLC transistor 55 and Vcelsrc, for instance, so that the BLC transistor 55 is in a non-conductive state.

Step 1103 includes increasing Vcelsrc and Vp-well to an initial voltage, e.g., 1.3 V, such as depicted at plots 1230 and 1240, respectively, in FIG. 12.

Next, steps 1104 and 1105 are performed. These steps can be concurrent, at least in part, and can occur at t2-t4 in FIG. 12. Step 1104 includes setting Vblc at a voltage, e.g., 2.5 V, which allows a current, Icell, to flow in the NAND string. Vblc can be set at a level which is higher than the sum of the Vth of the BLC transistor and Vcelsrc, e.g., higher than 0.7+1.3=2 V. When the BLC transistor is conductive, Vbl follows Vblc as Vblc–Vth–Vcelsrc.

Step 1105 includes decreasing Vcelsrc by Vkick for a specified period of time, tkick, while keeping Vp-well constant, such as depicted at plots 1230 and 1240, respectively, in FIG. 12. Generally, Vp-well and Vcelsrc can be set so that Vp-well>Vcelsrc during the voltage kick. Vp-well can be held constant or increase during the voltage kick. That is, Vp-well can be non-decreasing during the voltage kick. Plot 1241 in FIG. 12 shows an option where Vp-well increases during the voltage kick.

Vkick is the amount by which Vcelsrc is temporarily decreased from a first voltage, Vcelsrc1. Vkick can be 0.2-0.5 V, for example. The voltage kick increases Icell by reducing the channel resistance, as discussed.

Step 1106 includes, at the end of tkick, increasing Vcelsrc back to the initial voltage, such as depicted at plot 1230 at t4-t6 in FIG. 12. Step 1107 includes comparing Icell to a reference current, such as depicted at plot 1250 at t7-t8 in FIG. 12. The sensing process is done at step 1108.

Optionally, step 1107 compares Icell to a reference current during more than one read voltage, such as depicted by VrA at t7-t8 and VrE at t10-t11 in FIG. 12. The sensing process is done at step 1108.

FIG. 12 depicts example voltage signals and Icell in a read operation, consistent with FIG. 11. This example involves reading a lower page of data in an eight-state memory device, using the read voltages VrA and VrE. At plot 1200, VWL_sel, the voltage of the selected word line, increases from 0 V to VrA at t0-t1. The WL driver is requested to change VWL_sel from 0 V to VrA at t0, but the actual voltage increase is delayed by the relatively large RC delay of the word line layer. Optionally, VWL_sel is increased by requesting an output greater than VrA, then requesting an output of 0 V, then requesting an output of VrA, in an example of spiking VWL_sel.

In a first sense period t7-t8, VWL_sel=VrA. VWL_sel is then increased to VrE at t9-t10 for sensing in a second sense period t10-t11.

Plot 1210 depicts the voltage of the unselected word lines, VWL_unsel, e.g., WLDS to WLn−1 and WLn+1 to WLDD in FIG. 7A. VWL_unsel increases from 0 V to Vread, e.g., 8-9 V, at t0-t2. The WL driver is requested to change VWL_unsel from 0 V to Vread at t0, but the actual voltage increase is delayed by the relatively large RC delay of the word line layer. Plot 1211 depicts the voltage of the SGS transistors, Vsgs. Vsgs increases from 0 V to, e.g., 6 V, at t0-t2. Plot 1212 depicts the voltage of the selected SGD transistors, Vsgd_sel. Vsgd_sel and Vsgs increase from 0 V to, e.g., 6 V, at t0 to about t1. Vsgd_sel would likely reach the requested voltage before Vsgs reaches the requested voltage due to the lower RC of the SGD layer compared to the SGS layer.

Plot 1220 depicts Vblc, the control gate voltage of the BLC transistor 55 of FIG. 2. Vblc increases from 0 V to a first voltage, Vblc1, about 1.5 V, for example, at t0-t2. This voltage keeps the BLC transistor in a non-conductive state but prepares to transition it to the conductive state. Recall that the BLC transistor is in a non-conductive state if the gate-to-source voltage does not exceed the Vth of the transistor. With the source at Vcelsrc=1.3 V, Vth=0.7 V and Vcg at 1.5, Vcg−Vcelsrc<Vth or 1.5 V−1.3 V=0.2 V which is less than 0.7 V. Vblc increases from the first voltage to a second voltage, Vblc2, e.g., 2.5 V, at t2-t3. The second voltage provides the BLC transistor in a conductive state since Vcg−Vcelsrc>Vth, or 2.5 V−1.3 V=1.2 V which is greater than 0.7 V. This provides a conductive path from the NAND string to the sense circuit which allows Icell to ramp up. Generally, the BLC transistor is controlled by the sense circuit to bias the drain end of the NAND string. During the voltage kick down of Vcelsrc, the bias may comprise a positive voltage which is high enough to allow a current to flow in the NAND string if the selected memory cell is in a conductive state. A control circuit can be configured to issue a command via a memory interface to transition the bit line clamp transistor from a non-conductive state to a conductive state at a start of the temporary voltage kick down, e.g., at t2. The bit line clamp transistor may remain in a conductive state for a remainder of the sensing operation, e.g., until t12.

The increase in Vblc to Vblc2 overlaps with the voltage kick in Vcelsrc at t2-t4. The start of the increase in Vblc at t2 may be concurrent with the start of the voltage kick down. At t3-t4, Vblc decreases to a third voltage, Vblc3, e.g., 2 V, which may be greater than Vblc1. The third voltage provides the BLC transistor in a conductive state since Vcg−Vcelsrc>Vth, or 2 V−1 V=1 V which is greater than 0.7 V.

This example involves increasing a control gate voltage of the bit line clamp transistor from a first voltage to a second voltage at a first part (e.g., t2-t3) of the temporary voltage kick down, and decreasing the control gate voltage from the second voltage to a third voltage at a second part (e.g., t3-t4) of the temporary voltage kick down. This example further involves increasing the control gate voltage of the bit line clamp transistor from the third voltage to a fourth voltage after the temporary voltage kick down, wherein the sensing of the selected memory cell occurs with the control gate voltage of the bit line clamp transistor at the fourth voltage. By providing Vblc3<Vblc4, Ipeak1 does not become too high. In another option, Vblc3≥Vblc4.

At t4-t6, Vblc increases to a fourth voltage, Vblc4, e.g., 2.2 V, which is appropriate for sensing. In one approach, Vblc2>Vblc3. Using a higher Vblc2 during the reduction in Vcelsrc (compared to the Vblc4 used during sensing) can help increase the ramp up rate of Icell. The decrease in Vblc from t3-t4 helps stabilize Icell. In another option, Vblc2≤Vblc4.

Plot 1230 depicts Vcelsrc, a source voltage signal. Vcelsrc increases from 0 V to a first voltage, Vcelsrc1, e.g., 1.3 V, at t0-t1 and stabilizes at t1-t2. At t2, Vcelsrc is requested to decrease by a voltage Vkick, e.g., 0.3 V, to reduce the channel resistance of the NAND string, as discussed. This reduction is referred to as a voltage kick down. Vcelsrc remains at a reduced, second voltage, Vcelsrc2, e.g., 1 V, until t4, where it is requested to return to Vcelsrc1, for example. Vcelsrc may remain at Vcelsrc1 during the remainder of the sensing, e.g., until t12. In this example, the values of Vcelsrc are equal before and after the voltage kick down.

Optionally, Vcelsrc before the voltage kick down is different than Vcelsrc after the voltage kick down. Generally, a resistance of the channel layer is reduced by the temporary voltage kick down of the source voltage signal while the body voltage signal remains at its respective first voltage, Vp-well1.

Plot 1240 depicts Vp-well, a body voltage signal. Vp-well increases from 0 V to a first voltage, Vp-well1 (which may be equal to Vcelsrc1) at t0-t1 and stabilizes at t1-t2, similar to the increase in Vcelsrc, in this example. Optionally, Vp-well1 is different than Vcelsrc1. At t2-t12, in the remainder of the sensing process, Vp-well can remain constant at Vp-well1. Optionally, the value of Vp-well can change during tkick. For example, Vp-well can increase during tkick. Plot 1241 shows an option where Vp-well increases to Vp-well2>Vp-well1 during the voltage kick. Vcelsrc1 during tkick, in one approach.

Plot 1250 depicts Icell, the current in a NAND string involved in the sensing process. Icell is zero at t0-t2 because the BLC transistor is non-conductive. Icell reaches Ipeak at about t3. At t2, Icell starts to increase to a peak level, Ipeak1. At t4-t6, Icell decreases to a target level for sensing, Itarget, as Vcelsrc increases. In this example, Ipeak1 is greater than Itarget. This can help increase the ramp up rate of Icell. In other options, Ipeak1 could be less than or equal to Itarget. In an example consistent with plot 1250, the sense circuit is configured to sense a selected memory cell in the NAND string after the temporary voltage kick down, and a peak current in the NAND string during the temporary voltage kick down is greater than a target current in the NAND string during the sensing of the selected memory cell. The plot 1250 is based on the selected memory cell being in a conductive state, e.g., VWL_sel>Vth of the selected memory cell. Icell would be lower if the selected memory cell was not in a conductive state.

Plots 1260 and 1270 represent a comparison case, where Vp-well has a kick down at the same time as the kick down in Vcelsrc. Plot 1260 represents both Vcelsrc and Vp-well. Vcelsrc and Vp-well increase from 0 V to the first voltage, Vcelsrc1 at t0-t1 and stabilize at t1-t2. At t2, Vcelsrc and Vp-well are requested to decrease by Vkick. Since both voltages decrease together, there is no reduction in the channel resistance of the NAND string. Vcelsrc and Vp-well remain at a reduced, second voltage, Vcelsrc2, until t4, where they are requested to return to Vcelsrc1. Vcelsrc and Vp-well remain at Vcelsrc1 during the sensing.

Plot 1270 depicts Icell_comp, a comparison current which is consistent with the plot 1260. Icell_comp is zero at t0-t2. At t2, Icell_comp increases to a peak level, Ipeak2, which may be less than Ipeak1. At t5-t7, Icell decreases to Itarget, as Vcelsrc increases. Icell_comp reaches Vpeak at about t4, which is later than Icell reaching Vpeak at about t3 in plot 1250. This demonstrates the higher ramp up rate of Icell using the techniques described herein. Since Icell_comp reaches Vpeak at a later time, the sensing is delayed and the overall time of the read operation is increased.

In the example of FIG. 12, the voltage of the body voltage signal is constant at Vp-well1 throughout the temporary voltage kick down, e.g., from t2-t4. Also, the voltage of the body voltage signal is equal to the voltage of the source voltage signal at a start of the temporary voltage kick down, e.g., at t2. Also, the voltage of the source voltage signal during the sensing is equal to a voltage of the source voltage signal, e.g., Vcelsrc1, at a start of the temporary voltage kick down. Also, a bit line clamp transistor is connected to the drain end of the NAND string, and a control circuit is configured to temporarily increase a control gate voltage of the bit line clamp transistor, e.g., to Vblc2, during the temporary voltage kick down.

FIG. 13 depicts a plot of Vkick and/or tkick versus a selected sub-block, representing a distance from a WL driver, consistent with FIG. 8. As mentioned, in a read operation for a NAND string, the magnitude and/or duration of the negative voltage kick can be adjusted based on various factors such as the position of the NAND string in the block and the distance of the NAND string from a WL driver. In one approach, this is implemented by adjusting Vkick and/or tkick based on the sub-block which is being read. An assumption is that SB0 is closest to the WL driver and SB3 is furthest. Accordingly, SB3 has the largest RC delay when setting the word line voltage. A solution is to provide a progressively larger Vkick and/or tkick for sub-blocks which are progressively further from the WL driver. Generally, when performing a read operation for a NAND string in a selected sub-block, Vkick and/or tkick can be set as a function of a position of the selected sub-block among the plurality of sub-blocks of a block.

By adjusting Vkick and/or tkick, the read time can be kept constant across the sub-blocks.

In one approach, a NAND string involved in a read operation is in a selected sub-block of a block, and a control circuit is configured to adjust a magnitude and/or duration of the temporary voltage kick down of Vcelsrc based on a position of the selected sub-block in the block.

Accordingly, it can be see that in one implementation, an apparatus comprises: a control circuit configured to connect to a sense circuit and a NAND string, the NAND string comprising a source end and a drain end, the drain end is connected to the sense circuit, and the NAND string comprising a plurality of memory cells including a selected memory cell; and a memory interface connected to the control circuit. The control circuit is configured to issue a command via the memory interface to bias the NAND string with a source voltage signal and a body voltage signal, the source voltage signal and the body voltage signal increase to respective first voltages after which the source voltage signal has a temporary voltage kick down while the body voltage signal is non-decreasing, and to control the sense circuit to bias the drain end of the NAND string during the temporary voltage kick down and to sense the selected memory cell after the temporary voltage kick down.

In another implementation, a method comprises: increasing a current in a channel of a NAND string to a peak level, the increasing the current comprises applying a source voltage signal and a body voltage signal to the NAND string, the source voltage signal and the body voltage signal increase to respective first voltages after which the source voltage signal has a temporary voltage kick down while the body voltage signal is non-decreasing; and after the increasing the current to the peak level, reducing the current to a target level and sensing a selected memory cell in the NAND string.

In another implementation, an apparatus comprises: a control circuit configured to connect to a substrate and to a NAND string on the substrate, the substrate comprising a n+ contact and a p+ contact, the NAND string comprising a source end, a drain end, a channel layer and a plurality of memory cells, and the control circuit, to perform a read operation for a selected memory cell of the plurality of memory cells, is configured to: apply a source voltage signal to the n+ contact, the source voltage signal comprising a temporary voltage kick down; apply a body voltage signal to the p+ contact, a voltage of the body voltage signal is greater than a voltage of the source voltage signal during the temporary voltage kick down; and after the temporary voltage kick down, sense a current in the NAND string.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a control circuit configured to connect to a sense circuit and a NAND string, the NAND string comprising a source end and a drain end, the drain end is connected to the sense circuit, and the NAND string comprising a plurality of memory cells including a selected memory cell; and
   a memory interface connected to the control circuit, the control circuit is configured to issue a command via the memory interface to bias the NAND string with a source voltage signal and a body voltage signal, the source voltage signal and the body voltage signal increase to respective first voltages after which the source voltage signal has a temporary voltage kick down while the body voltage signal is non-decreasing and to control the sense circuit to bias the drain end of the NAND string during the temporary voltage kick down and to sense the selected memory cell after the temporary voltage kick down; wherein:
   the sense circuit comprises a bit line clamp transistor; and
   the control circuit is configured to issue a command via the memory interface to transition the bit line clamp transistor from a non-conductive state to a conductive state at a start of the temporary voltage kick down.

2. The apparatus of claim 1, wherein:
   the NAND string extends vertically on a substrate;
   the source end is in contact with a p-well of the substrate; and
   the control circuit is configured to apply the source voltage signal and the body voltage signal to the p-well.

3. The apparatus of claim 2, wherein:
   the control circuit is configured to apply the source voltage signal to an n+ contact in the p-well and to apply the body voltage signal to a p+ contact in the p-well.

4. The apparatus of claim 2, wherein:
   the NAND string comprises a channel layer; and
   the control circuit is configured to bias one portion of the channel layer with the source voltage signal and another portion of the channel layer with the body voltage signal.

5. The apparatus of claim 4, wherein:
   an inversion layer is formed by the biasing of the one portion of the channel layer with the source voltage signal.

6. The apparatus of claim 4, wherein:
   the control circuit is configured to reduce a resistance of the channel layer with the temporary voltage kick down of the source voltage signal while the body voltage signal is non-decreasing.

7. The apparatus of claim 1, wherein:
the NAND string is in a selected sub-block of a block; and
the control circuit is configured to adjust a magnitude and/or duration of the temporary voltage kick down based on a position of the selected sub-block in the block.

8. The apparatus of claim 1, wherein:
the NAND string extends horizontally on a substrate; and
the control circuit is configured to apply the source voltage signal to an n+ contact in a p-well of the substrate to apply the body voltage signal to a p+ contact in the p-well of the substrate.

9. The apparatus of claim 1, wherein:
a peak current in the NAND string during the temporary voltage kick down is greater than a target current in the NAND string during the sensing of the selected memory cell.

10. The apparatus of claim 1, wherein:
the body voltage signal remains at its respective first voltage during the temporary voltage kick down.

11. A method, comprising:
increasing a current in a channel of a NAND string to a peak level, the increasing the current comprises applying a source voltage signal and a body voltage signal to the NAND string, the source voltage signal and the body voltage signal increase to respective first voltages after which the source voltage signal has a temporary voltage kick down while the body voltage signal is non-decreasing; and
after the increasing the current to the peak level, reducing the current to a target level and sensing a selected memory cell in the NAND string; wherein:
a bit line clamp transistor is connected to a drain end of the NAND string, the method further comprising:
increasing a control gate voltage of the bit line clamp transistor from a first voltage to a second voltage at a first part of the temporary voltage kick down; and
decreasing the control gate voltage of the bit line clamp transistor from the second voltage to a third voltage at a second part of the temporary voltage kick down.

12. The method of claim 11, wherein:
the NAND string extends vertically on a substrate;
a source end of the NAND string is in contact with a p-well of the substrate; and
the source voltage signal and the body voltage signal are applied to the p-well.

13. The method of claim 11, further comprising:
increasing the control gate voltage of the bit line clamp transistor from the third voltage to a fourth voltage after the temporary voltage kick down, wherein the sensing of the selected memory cell occurs with the control gate voltage of the bit line clamp transistor at the fourth voltage.

14. An apparatus, comprising:
a control circuit configured to connect to a substrate and to a NAND string on the substrate, the substrate comprising a n+ contact and a p+ contact, the NAND string comprising a source end, a drain end, a channel layer and a plurality of memory cells, and the control circuit, to perform a read operation for a selected memory cell of the plurality of memory cells, is configured to:
apply a source voltage signal to the n+ contact, the source voltage signal comprising a temporary voltage kick down;
apply a body voltage signal to the p+ contact, a voltage of the body voltage signal is greater than a voltage of the source voltage signal during the temporary voltage kick down; and
after the temporary voltage kick down, sense a current in the NAND string; wherein:
a bit line clamp transistor is connected to the drain end of the NAND string; and
the control circuit is configured to temporarily increase a control gate voltage of the bit line clamp transistor during the temporary voltage kick down.

15. The apparatus of claim 14, wherein:
the voltage of the body voltage signal is constant throughout the temporary voltage kick down.

16. The apparatus of claim 14, wherein:
the voltage of the body voltage signal is equal to the voltage of the source voltage signal at a start of the temporary voltage kick down.

17. The apparatus of claim 14, wherein:
the voltage of the source voltage signal during the sensing is equal to a voltage of the source voltage signal at a start of the temporary voltage kick down.

* * * * *